United States Patent [19]

Bhansali et al.

[11] Patent Number: 5,786,630
[45] Date of Patent: Jul. 28, 1998

[54] MULTI-LAYER C4 FLIP-CHIP SUBSTRATE

[75] Inventors: Ameet Bhansali; Qing Zhu, both of Freemont, Calif.

[73] Assignee: Intel Corporation, Santa Clara, Calif.

[21] Appl. No.: 693,397

[22] Filed: Aug. 7, 1996

[51] Int. Cl.⁶ .......................... H01L 23/48; H01L 23/52; H01L 23/053; H01L 23/02
[52] U.S. Cl. .................. 257/697; 257/737; 257/700; 257/723; 257/924; 257/778
[58] Field of Search ............................. 257/700, 778, 257/723, 737, 697, 8, 924

[56] References Cited

U.S. PATENT DOCUMENTS

| | | | |
|---|---|---|---|
| 5,508,938 | 4/1996 | Wheeler | 364/488 |
| 5,608,261 | 3/1997 | Bhattacharyya et al. | 257/700 |
| 5,635,761 | 6/1997 | Cao et al. | 257/700 |
| 5,635,767 | 6/1997 | Wenzel et al. | 257/778 |
| 5,654,590 | 8/1997 | Kuramochi | 257/778 |

*Primary Examiner*—Teresa M. Arroyo
*Attorney, Agent, or Firm*—Blakely, Sokoloff, Taylor & Zafman

[57] ABSTRACT

An integrated circuit package which contains an integrated circuit that is mounted to a plurality of contact pads located on a top surface of a substrate. The package may also have a number of capacitors that are mounted to the contact pads. The substrate has an internal first power plane and an internal first ground plane located adjacent to the top surface and coupled to the contact pads by a plurality of vias. The power and ground planes are coupled to the capacitors and the integrated circuit, such that the capacitors filter power that is provided to the circuit. Locating the power and ground planes near the top surface minimizes the length of the vias and lowers the self inductance of the package. The contact pads of the capacitors may be arranged in alternating rows of ground and power to increase the mutual inductance and lower the effective inductance of the package. The package has additional power/ground planes and layers of signal routing traces located between the first ground plane and the bottom surface to couple the contact pads with a plurality of pins that extend from the bottom surface of the package. The first power and ground planes are separated by a dielectric spacing that is significantly smaller than the dielectric spacing separating the other planes and traces. The smaller dielectric spacing increases the capacitance and reduces the effective inductance of the substrate to reduce the switching noise of the integrated circuit.

20 Claims, 1 Drawing Sheet

MULTI-LAYER C4 FLIP-CHIP SUBSTRATE

BACKGROUND OF THE INVENTION

1. Field of the Invention

The present invention relates to an integrated circuit package.

2. Description of Related Art

Integrated circuits are typically housed within a package that is mounted to a printed circuit board. One such type of package is commonly referred to as a "flip chip" or "C4" package. Flip chip packages contain an integrated circuit which has a plurality of solder bumps located on the bottom of the die. The solder bumps are soldered to corresponding contact pads located on a top surface of a substrate. The substrate typically has a plurality of pins located on an opposite bottom surface of the substrate. The pins are coupled to an external printed circuit board. The contact pads located on the top surface of the substrate are typically coupled to the pins on the bottom surface by internal power/ground planes, routing traces and vias.

The internal routing of the substrate creates switching noise that limits the speed of the integrated circuit. The switching noise can be particularly critical to a highly functional integrated circuit such as a microprocessor. It is therefore desirable to minimize the switching noise created by the substrate.

Switching noise is a function of the effective inductance and capacitance of the substrate. Noise will decrease with an increase in the substrate capacitance and/or a reduction in the effective inductance. It is desirable to provide a flip chip package which increases the capacitance, reduces the effective inductance and minimizes the noise created by the package.

SUMMARY OF THE INVENTION

The present invention is an integrated circuit package which contains an integrated circuit that is mounted to a plurality of contact pads located on a top surface of a substrate. The package may also have a number of capacitors that are mounted to the contact pads. The substrate has an internal first power plane and an internal first ground plane located adjacent to the top surface and coupled to the contact pads by a plurality of vias. The power and ground planes are coupled to the capacitors and the integrated circuit, such that the capacitors filter power that is provided to the circuit. Locating the power and ground planes near the top surface minimizes the length of the vias and lowers the self inductance of the package. The contact pads of the capacitors may be arranged in alternating rows of ground and power to increase the mutual inductance and lower the effective inductance of the package. The package has additional power/ground planes and layers of signal routing traces located between the first ground plane and the bottom surface to couple the contact pads with a plurality of pins that extend from the bottom surface of the package. The first power and ground planes are separated by a dielectric spacing that is significantly smaller than the dielectric spacing separating the other planes and traces. The smaller dielectric spacing increases the capacitance and reduces the effective inductance of the substrate to reduce the switching noise of the integrated circuit.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
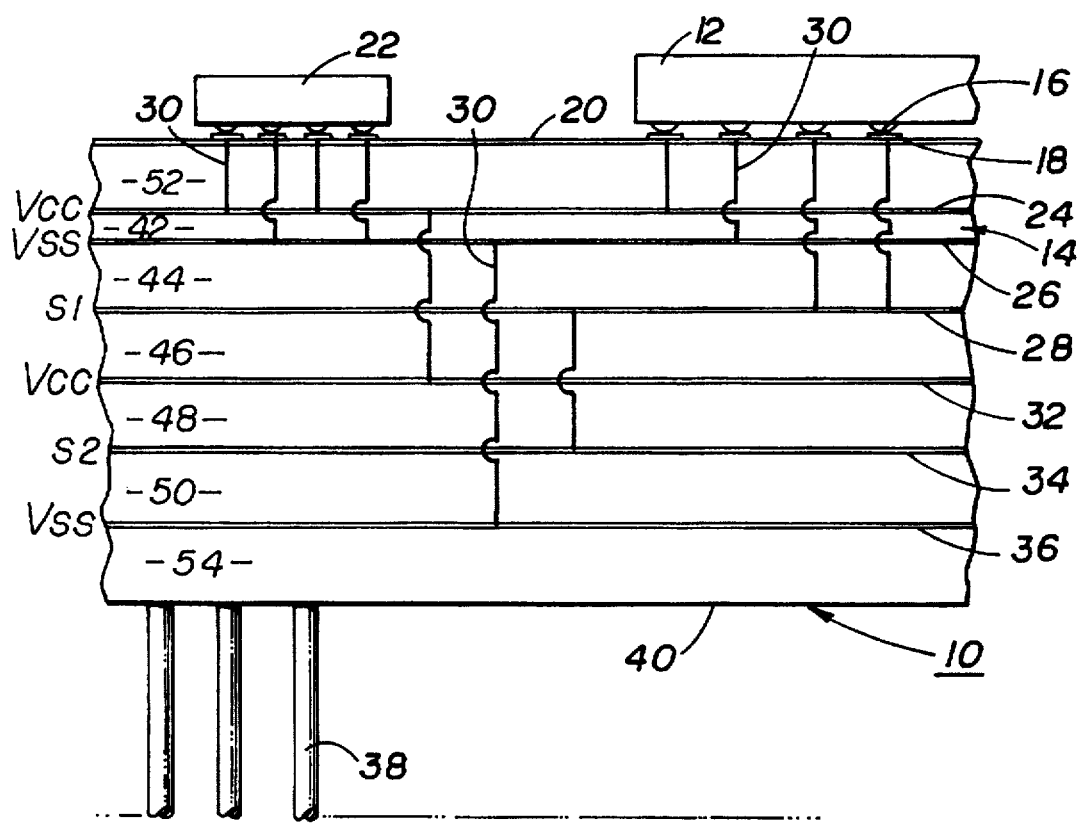
FIG. 1 is a side cross-sectional view of an integrated circuit package of the present invention.

Referring to the drawings more particularly by reference numbers, FIG. 1 shows an integrated circuit package 10 of the present invention. The package 10 includes an integrated circuit 12 that is mounted to a substrate 14. The integrated circuit 12 is preferably a microprocessor. Although an integrated circuit 12 is shown and described, it is to be understood that the package 10 may contain any electrical device. The substrate 14 is typically constructed from co-fired ceramic processes known in the art, although it is to be understood that the substrate 14 may be constructed with other known packaging materials and processes. By way of example, the substrate 14 may be constructed as a printed circuit board.

The integrated circuit 12 has a number of solder bumps 16 that are soldered to corresponding contact pads 18 located on a top surface 20 of the substrate 14. An integrated circuit directly mounted to a substrate is commonly referred to as a "flip chip" or "C4" package and is known in the art. The package 10 may also have one or more capacitors 22 mounted to corresponding contact pads 18 of the substrate 14. The capacitors 22 typically filter the power provided to the integrated circuit 12.

The substrate 14 has a first power plane 24, a first ground plane 26 and a first layer of signal routing traces 28 that are coupled to the capacitors 22 and integrated circuit 12 by a plurality of vias 30. The substrate 14 may also have a second power plane 32, a second ground plane 36 and a second layer of signal routing traces 34 located between the first ground plane 26 and a bottom surface 40 of the substrate 14. The second power plane 32 and second ground plane 36 are coupled to the first power plane 24 and the first ground plane 26, respectively, by a plurality of vias 30. Likewise, the second layer of signal routing traces 34 are coupled to the first layer of routing traces 28 by vias 30.

The second power plane 32, second ground plane 36 and second layer of signal routing traces 34 are coupled to a plurality of pins 38 that extend from the bottom surface 40 of the substrate 14. The pins 38 are typically mated with a corresponding socket (not shown) that is mounted to an external printed circuit board (not shown). Alternatively, the pins 38 may be soldered directly to the external printed circuit board. The pins 38 that are coupled to the power and ground planes of the substrate are connected to the power and ground busses of the external printed circuit board to provide power to the integrated circuit 12. The pins 38 that are coupled to the routing traces of the substrate are connected to digital signal lines of the external circuit board to provide signals to the integrated circuit. Although pins 38 are shown and described, it is to be understood that the package may have other types of external contacts such as solder balls.

The substrate 14 is constructed to minimize the switching noise of the integrated circuit 12. Switching noise is proportional to the square of the electrical frequency (Wo), the effective inductance of the electrical path (Leff) and the inverse of the capacitance (1/C) of the electrical path. The effective inductance is defined as the difference between the self inductance (Ls) of an electrical path and the mutual inductance (Lm) of the electrical path (i.e. Leff=Ls–Lm). To reduce switching noise it is desirable to increase the capacitance C, decrease the self inductance Ls and increase the mutual inductance Lm of the substrate 14.

By locating the first power 24 and ground 26 planes near the contacts pads 18, the substrate minimizes the length of the vias and the self inductance between the planes and the devices 12 and 22. The short via lengths also minimize the electrical resistance of the electrical paths.

The first power plane 24 is separated from the first ground plane 26 by a first dielectric space 42. The first layer of signal routing spaces 28 is separated from the first ground plane 26 by a second dielectric space 44. The second power plane 32 is separated from the first layer of signal routing traces 28 by a third dielectric space 46. The second layer of signal routing traces 34 is separated from the second power plane 32 by a fourth dielectric space 48. The second ground plane 36 is separated from the second layer of signal routing traces 34 by a fifth dielectric space 50. The first power plane 24 and second ground plane 36 are separated from the top 20 and bottom 38 surfaces by sixth 52 and seventh 54 dielectric spaces, respectively.

The first dielectric space 42 has a width that is less than widths of the other dielectric spaces 44–54. The relatively narrow first dielectric space 42 increases the capacitance and mutual inductance between the first power 24 and ground 26 planes. The higher capacitance and mutual inductance decrease the switching noise of the integrated circuit. In the preferred embodiment, the width of the first dielectric space 42 is 0.002 inches and the widths of the second, third, fourth, fifth, sixth and seventh dielectric spaces are each 0.008 inches.

Figure 2:
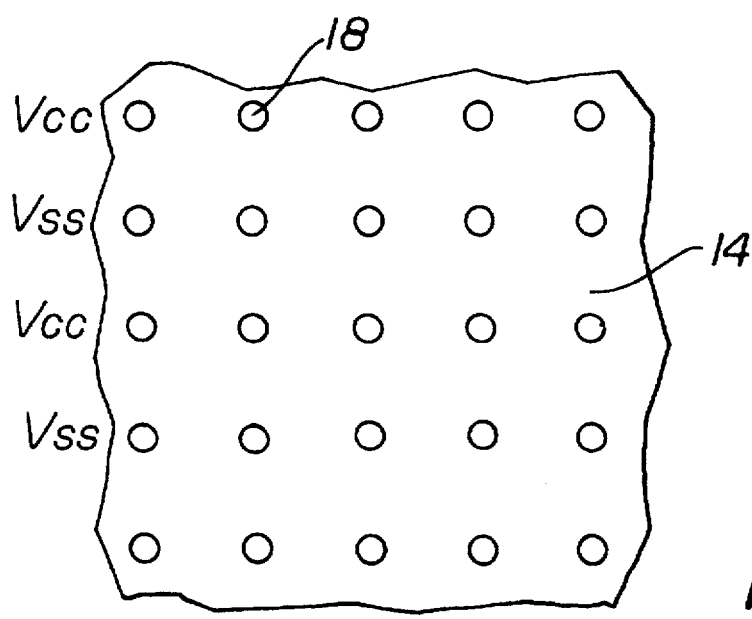
FIG. 2 is an enlarged top view of a substrate of the package.

As shown in FIG. 2, the contact pads 18 that are attached to the capacitors 22 are arranged in rows that alternate between power Vcc and ground Vss. The alternating capacitor pins increase the mutual inductance of the vias 30 that couple the planes to the capacitors and further decrease the impedance and resultant switching noise created by the package. The present invention therefore provides a number of features that increase the capacitance and decrease the self inductance of a package, to reduce the switching noise of an integrated circuit.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:
    a substrate which has a top surface and an opposite bottom surface, said substrate having a first power plane located adjacent to said top surface, a first ground plane located between said first power plane and said bottom surface and a first layer of signal routing traces located between said first ground plane and said bottom surface, a plurality of contacts pads that are located on said top surface and coupled to said first power plane, said first ground plane and said first layer of signal routing traces, and a plurality of contacts that are located at said bottom surface and coupled to said first power plane, said first ground plane and said first layer of signal routing traces; and
    a capacitor which has at least three rows of pins alternating in connection with said first power plane and said first ground plane.

2. The package as recited in claim 1, wherein said first power plane is separated from said first ground plane by a first dielectric space and said first layer of signal routing traces is separated from said first ground plane by a second dielectric space, wherein said second dielectric space is larger than said first dielectric space.

3. The package as recited in claim 2, wherein said first dielectric space is approximately 0.002 inches wide and said second dielectric space is approximately 0.008 inches wide.

4. The package as recited in claim 1, further comprising a capacitor mounted to said contact pads and coupled to said first power plane and said first ground plane.

5. The package as recited in claim 1, further comprising a second power plane located between said first layer of signal routing traces and said bottom surface, a second layer of signal routing traces located between said second power plane and said bottom surface, and a second ground plane located between said second layer of signal routing traces and said bottom surface.

6. The package as recited in claim 1, wherein said contacts are pins.

7. An electronic package, comprising:
    a substrate which has a top surface and an opposite bottom surface, said substrate having a first power plane located adjacent to said top surface, a first ground plane located between said first power plane and said bottom surface, a first layer of signal routing traces located between said first ground plane and said bottom surface, a second power plane that is located between said first layer of signal routing traces and said bottom surface and is coupled to said first power plane, a second layer of signal routing traces that is located between said second power plane and said bottom surface and is coupled to said first layer of signal routing traces, and a second ground plane located between said second layer of signal routing traces and said bottom surface and is coupled to said first ground plane, a plurality of contacts pads that are located on said top surface and are coupled to said first power plane, said first ground plane and said first layer of signal routing traces, and a plurality of contacts that are located on said bottom surface and are coupled to said second power plane, said second ground plane and said second layer of signal routing traces; and,
    a capacitor mounted to said contact pads of said substrate and coupled to said first power plane and said first ground plane, said capacitor has at least three rows of pins alternating in connection with said first power plane and said first ground plane.

8. The package as recited in claim 7, wherein said first power plane is separated from said first ground plane by a first dielectric space, said first layer of signal routing traces is separated from said first ground plane by a second dielectric space, said second power plane is separated from said first layer of signal routing traces by a third dielectric space, said second layer of signal routing traces is separated from said second power plane by a fourth dielectric space and said second ground plane is separated from said second layer of signal routing traces by a fifth dielectric space, wherein said second, third, fourth and fifth dielectric spaces are larger than said first dielectric space.

9. The package as recited in claim 8, wherein said first dielectric space is approximately 0.002 inches wide and said second, third, fourth and fifth dielectric spaces are approximately 0.008 inches wide.

10. The package as recited in claim 7, wherein said contacts are pins.

11. An integrated circuit package, comprising:

a substrate which has a top surface and an opposite bottom surface, said substrate having a first power plane located adjacent to said top surface, a first ground plane located between said first power plane and said bottom surface and a first layer of signal routing traces located between said first ground plane and said bottom surface, a plurality of contacts pads that are located on said top surface and coupled to said first power plane, said first ground plane and said first layer of signal routing traces, and a plurality of contacts that are located at said bottom surface and coupled to said first power plane, said first ground plane and said first layer of signal routing traces; and, an integrated circuit that is mounted to said contact pads and coupled to said first power plane, said first ground plane and said first layer of signal routing traces; and, a capacitor which has at least three rows of pins alternating in connection with said first power plane and said first ground plane.

12. The package as recited in claim 11, wherein said first power plane is separated from said first ground plane by a first dielectric space and said first layer of signal routing traces is separated from said first ground plane by a second dielectric space, wherein said second dielectric space is larger than said first dielectric space.

13. The package as recited in claim 12, wherein said first dielectric space is approximately 0.002 inches wide and said second dielectric space is approximately 0.008 inches wide.

14. The package as recited in claim 12, further comprising a capacitor mounted to said contact pads and coupled to said first power plane and said first ground plane.

15. The package as recited in claim 12, further comprising a second power plane located between said first layer of signal routing traces and said bottom surface, a second layer of signal routing traces located between said second power plane and said bottom surface, and a second ground plane located between said second layer of signal routing traces and said bottom surface.

16. The package as recited in claim 12, wherein said contacts are pins.

17. An integrated circuit package, comprising:

a substrate which has a top surface and an opposite bottom surface, said substrate having a first power plane located adjacent to said top surface, a first ground plane located between said first power plane and said bottom surface, a first layer of signal routing traces located between said first ground plane and said bottom surface, a second power plane that is located between said first layer of signal routing traces and said bottom surface and is coupled to said first power plane, a second layer of signal routing traces that is located between said second power plane and said bottom surface and is coupled to said first layer of signal routing traces, and a second ground plane located between said second layer of signal routing traces and said bottom surface and is coupled to said first ground plane, a plurality of contacts pads that are located on said top surface and are coupled to said first power plane, said first ground plane and said first layer of signal routing traces, and a plurality of contacts that are located on said bottom surface and are coupled to said second power plane, said second ground plane and said second layer of signal routing traces;

a capacitor mounted to said contact pads of said substrate and coupled to said first power plane and said first ground pad, said capacitor has at least three rows of pins alternating in connection with said first power plane and said first ground plane; and, an integrated circuit that is mounted to said contact pads and coupled to said first power plane, said first ground plane and said first layer of signal routing traces.

18. The package as recited in claim 17, wherein said first power plane is separated from said first ground plane by a first dielectric space, said first layer of signal routing traces is separated from said first ground plane by a second dielectric space, said second power plane is separated from said first layer of signal routing traces by a third dielectric space, said second layer of signal routing traces is separated from said second power plane by a fourth dielectric space and said second ground plane is separated from said second layer of signal routing traces by a fifth dielectric space, wherein said second, third, fourth and fifth dielectric spaces are larger than said first dielectric space.

19. The package as recited in claim 18, wherein said first dielectric space is approximately 0.002 inches wide and said second, third, fourth and fifth dielectric spaces are approximately 0.008 inches wide.

20. The package as recited in claim 17, wherein said contacts are pins.

* * * * *